United States Patent
Tai et al.

(10) Patent No.: US 7,262,821 B2
(45) Date of Patent: Aug. 28, 2007

(54) LCD WITH FIRST AND SECOND CIRCUIT REGIONS EACH WITH SEPARATELY OPTIMIZED TRANSISTOR PROPERTIES

(75) Inventors: Mitsuharu Tai, Kokubunji (JP); Mutsuko Hatano, Kokubunji (JP); Shinya Yamaguchi, Mitaka (JP); Takeo Shiba, Kodaira (JP); Hideo Sato, Hitachi (JP)

(73) Assignee: Hitachi Displays, Ltd., Chiba-ken (JP)

( * ) Notice: Subject to any disclaimer, the term of this patent is extended or adjusted under 35 U.S.C. 154(b) by 35 days.

(21) Appl. No.: 10/772,431

(22) Filed: Feb. 6, 2004

(65) Prior Publication Data
US 2004/0257486 A1    Dec. 23, 2004

(30) Foreign Application Priority Data
Jun. 20, 2003    (JP)    ............................ P2003-176281

(51) Int. Cl.
*G02F 1/136*    (2006.01)
(52) U.S. Cl. ........................................... 349/43; 257/72
(58) Field of Classification Search .................. 349/43
See application file for complete search history.

(56) References Cited

U.S. PATENT DOCUMENTS

| | | | | |
|---|---|---|---|---|
| 5,851,440 | A * | 12/1998 | Tanaka et al. ................. | 257/66 |
| 6,249,333 | B1 * | 6/2001 | Zhang et al. ................. | 349/151 |
| 6,335,555 | B1 * | 1/2002 | Takemura et al. ........... | 257/408 |
| 6,479,837 | B1 * | 11/2002 | Ogawa et al. ................ | 257/59 |
| 6,509,940 | B2 * | 1/2003 | Kwak et al. .................. | 349/43 |
| 6,512,247 | B1 * | 1/2003 | Suzuki et al. ................. | 257/72 |
| 6,512,504 | B1 * | 1/2003 | Yamauchi et al. ............ | 345/87 |
| 6,673,639 | B2 * | 1/2004 | Wada et al. ................... | 438/14 |
| 6,887,724 | B2 * | 5/2005 | Nakamura et al. ............ | 438/14 |
| 2002/0142567 | A1 * | 10/2002 | Hagino et al. ............... | 438/487 |
| 2002/0158298 | A1 * | 10/2002 | Yamada ....................... | 257/471 |
| 2003/0160239 | A1 * | 8/2003 | Shinagawa et al. ........... | 257/64 |
| 2004/0038438 | A1 * | 2/2004 | Shih et al. ..................... | 438/30 |

OTHER PUBLICATIONS

James B. Boyce et al., "Laser Crystallization for Polycrystalline Silicon Device Applications", Technology and Applications of Amorphous Silicon, R.A. Street ed. (2000), pp. 95-146.

(Continued)

*Primary Examiner*—Andrew Schechter
*Assistant Examiner*—Phu Vu
(74) *Attorney, Agent, or Firm*—Reed Smith LLP; Stanley P. Fisher, Esq.; Juan Carlos A. Marquez, Esq.

(57) ABSTRACT

A large number of pixels PXL are arranged in a matrix fashion in a display region DSP on an insulating substrate. Disposed around the display region DSP are a drain-side pixel-driving circuit including a drain shift register DSR, a digital-to-analog converter circuit DAC, a drain level shifter DLS, a buffer BF and sampling switches SSW; and a gate-side pixel-driving circuit including a gate shift register GSR and a gate level shifter GLS, and various kinds of circuits. Current mobility of thin film transistors constituting a circuit region SX requiring high-speed operation of these pixel-driving circuits is improved by optimizing a combination of plural layouts, arrangements and configurations for the respective circuits to meet the specifications special for the respective circuits.

4 Claims, 17 Drawing Sheets

OTHER PUBLICATIONS

Akito Hara et al., "High Performance Poly-Si-TFTs on a Glass by a Stable Scanning CW Laser Lateral Crystallization", International Electron Devices Meeting (2001), pp. 747-750.

Mutsuko Hatano et al., "12.4L: Late News Paper: Selectively Enlarging Laser Crystallization Technology for High and Uniform Performance Poly-Si TFTs", SID 02 DIGEST (2002) pp. 158-161.

* cited by examiner

FIG.2

| | PIXEL | LEVEL SHIFTER BUFFER SAMPLING SWITCH | SHIFT REGISTER DA CONVERTER | INTERFACE CLOCKED SIGNAL GENERATOR | GRAY SCALE SIGNAL GENERATOR |
|---|---|---|---|---|---|
| PROPERTIES DEMANDED FOR EACH CIRCUITS TO WORK BETTER | HIGHER BREAKDOWN VOLTAGE LOW LEAKAGE CURRENT | HIGHTER BREAKDOWN VOLTAGE HIGHER ON-CURRENT HIGHER RELIABILITY | LOWER DRIVING VOLTAGE HIGHER ON-CURRENT | LOWER DRIVING VOLTAGE HOMOGENEOUS PERFORMANCE OF TFTS | HIGHER ON-CURRENT HOMOGENEOUS PERFORMANCE OF TFTS |
| PROFITS WHEN THE PROPERTIES MENTIONED ABOVE ARE ACHIEVED | CLEAR GRAY SCALE LONGER CHARGE STORAGE | CLEAR GRAY SCALE ENLARGING REGION OF PIXCELS HIGHER RESOLUTION | LOW POWER ENLARGING REGION OF PIXELS HIGHER RESOLUTION | LOW POWER HIGHER RELIABILITY | ENLARGING REGION OF PIXELS HIGHER RESOLUTION HIGHER RELIABILITY |

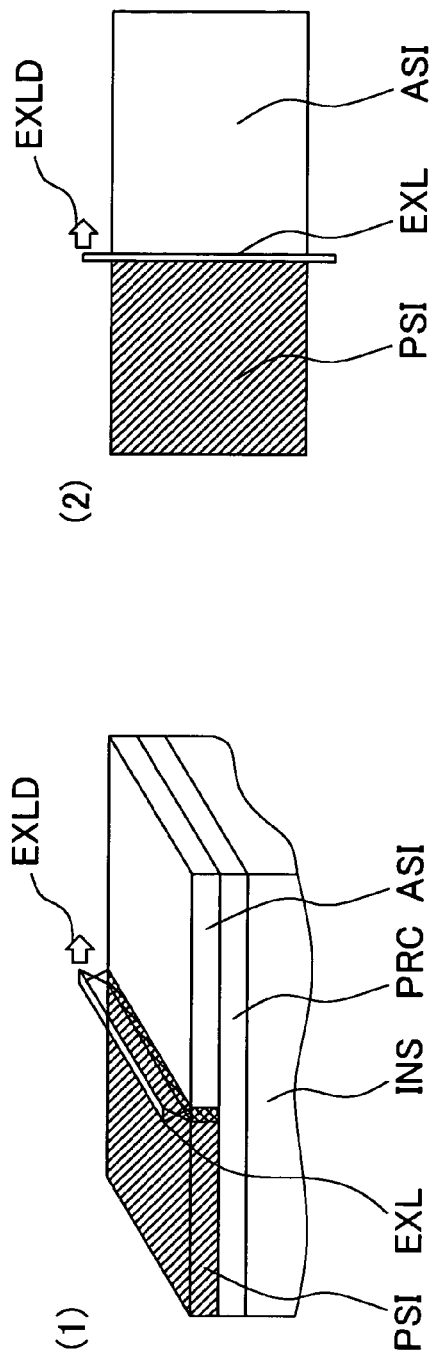
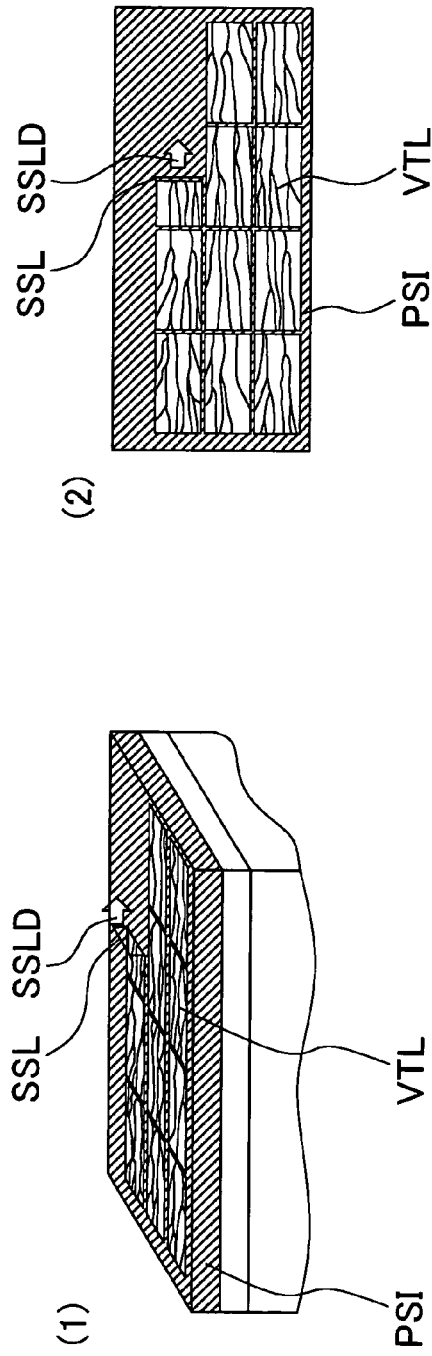

LCD WITH FIRST AND SECOND CIRCUIT REGIONS EACH WITH SEPARATELY OPTIMIZED TRANSISTOR PROPERTIES

BACKGROUND OF THE INVENTION

1. Field of the Invention

The present invention relates to an image display device, and particularly to an image display device provided with a circuit employing a thin film transistor capable of high-speed operation.

2. Description of Prior Art

Polycrystalline silicon thin film transistors (hereinafter also called polycrystalline silicon TFTS) have been developed as active elements forming pixels or pixel-driving circuits for active-matrix type liquid crystal display device (liquid crystal displays), organic light-emitting display devices (organic EL displays), and image sensors. Polycrystalline silicon TFTs have an advantage of greater driving capability over other driving circuit elements and peripheral circuits formed by polycrystalline silicon TFTs can be mounted on the same substrate mounting the pixels thereon.

In a case in which polycrystalline silicon TFTs are used for large-sized liquid crystal display devices such as TV receivers and large-sized monitors, the polycrystalline silicon TFTs are fabricated on a glass substrate which is an insulating substrate forming an active substrate of the display device (or the so-called active-matrix substrate), because of cost limitations. In a process of fabricating TFTs on a glass substrate, processing temperatures are determined by a withstand temperature of the glass substrate.

For formation of high-quality polycrystalline silicon films (hereinafter also called polycrystalline silicon films) on a glass substrate (hereinafter also called simply a substrate), crystallization by excimer laser is utilized as disclosed in Boyce, J. B. and P. Mei: "3. Laser Crystallization for Polycrystalline Silicon Device Application," Technology and Applications of Amorphous Silicon (2000), pp.94-146, Springer 2000.

In a case where integrated circuits of higher performance are to be incorporated into a pixel-driving circuit, polycrystalline silicon TFTs of higher performance need to be realized. Crystallization by using solid-state laser provides polycrystalline silicon films formed of crystalline grains having their sizes extended in a scanning direction of laser and uniform crystalline grain widths in a direction perpendicular to the scanning direction of laser, and having an even surface, as described in Hara, A. et al.: "High Performance Poly-Si TFTs on a Glass by a Stable Scanning CW Laser Lateral Crystallization," pp. 747-750, conference papers, International Electron Devices meeting (Washington D.C., 2001), and Hatano, M. et al.: "12.4L: Late-News Paper: Selectively Enlarging Laser Crystallization Technology for High and Uniform Performance Poly-Si TFTS," pp. 158-161, SID 02 DIGEST, Society for Information Display, International Symposium Digest 2002, for example. Polycrystalline silicon TFTs formed of the thus obtained polycrystalline silicon films were reported to have improved performances of thin film transistors.

SUMMARY OF THE INVENTION

Conventional polycrystalline silicon films crystallized by using excimer laser and used for thin film transistors have small crystalline grain sizes, and little anisotropy in shape of crystalline grains. Therefore, regardless of which direction thin film transistors were fabricated to orient in on a substrate, their performances remained much the same. Because of this, the arrangement of thin film transistors on the substrate has been determined with the principal object of minimizing the area occupied by the thin film transistors, and as a necessary consequence, there have been various thin film transistors which are oriented in various directions on the same substrate.

As explained above, crystallization by using solid-state laser provides polycrystalline silicon films formed of crystalline grains having their sizes extended in a scanning direction of laser and uniform crystalline grain widths in a direction perpendicular to the scanning direction of laser, and having an even surface. Performances of TFTs fabricated from theses polycrystalline silicon films makes it possible to incorporate circuits which could not be mounted on an active-matrix substrate, and thereby to make the active-matrix substrate highly functional. However, since silicon crystals were highly anisotropic in the conventional polycrystalline silicon films, conventional layouts could not obtain performances required for circuit operations in some cases.

It is an object of the present invention to provide an image display device provided on its insulating substrate with (1) a pixel section (also called a pixel region or a display region) having a large number of pixels arranged in a matrix fashion, and (2) a pixel-driving circuit section for driving the pixel section and formed of high-performance thin film transistor circuits operating on high current mobility (electron mobility, hole mobility).

The present invention is not limited to the conversion of polycrystalline silicon film such that semiconductor films formed on an insulating substrate of an image display device is improved to exhibit characteristics capable of providing the above-mentioned high current mobility, but is equally applicable to the conversion of semiconductor films formed on other substrates, for example, a silicon wafer.

To achieve the above-mentioned object, the present invention is carried out as follows:

Initially, a polycrystalline silicon film is obtained by converting an amorphous silicon film deposited over an entire area of an insulating substrate into a polycrystalline silicon film by irradiating excimer laser light over an entire surface of the amorphous silicon film, or an insulating substrate having a polycrystalline silicon film thereon is prepared by depositing a polycrystalline silicon thereon by using a chemical vapor deposition method (a CVD method).

Next, pulse-modulated laser light or quasi-CW laser light from solid-state laser is selectively irradiated onto a portion of the polycrystalline silicon film in a driving circuit region disposed around the pixel region on the above-explained insulating substrate while the laser is scanned in a specified direction to obtain discontinuous converted regions comprised of even band-shaped-crystal polycrystalline silicon films formed of crystalline grains having their sizes extended in the scanning direction of the laser light and uniform crystalline grain widths in a direction perpendicular to the scanning direction of the laser light.

The above-mentioned discontinuous converted regions are selected to be rectangular, and desired circuits are fabricated in the rectangular discontinuous converted regions, respectively. At this time, each of TFTs forming the circuits is oriented in a direction optimized to meet a specification of corresponding one of the circuits by considering TFT characteristics depending upon an orientation of a channel of the TFT with respect to the scanning direction of the laser light, in order to accomplish the above-mentioned object of the present invention.

In this specification, the above-explained method of fabricating discontinuous converted regions comprised of generally-band-shaped-crystal silicon films by using irradiation of pulse-modulated laser light or quasi-CW laser light will be called SELAX (Selectively Enlarging Laser Crystallization).

BRIEF DESCRIPTION OF THE DRAWINGS

In the accompanying drawings, in which like reference numerals designate similar components throughout the figures, and in which:

FIG. 2 is a table summarizing specifications required for respective circuits fabricated in respective driving circuit regions of the active-matrix substrate, and advantages obtained from the specifications.

FIGS. 3A(1) to 3B(2) are schematic diagrams illustrating a manner in which an amorphous film is converted into a polycrystalline silicon film having good quality.

DETAILED DESCRIPTION OF THE PREFERRED EMBODIMENTS

In the following, the embodiments in accordance with the present invention will be explained in detail by reference to the drawings. Here a case will be explained in which the present invention is applied to a liquid crystal display device which uses a glass substrate as its insulating substrate.

Figure 1:
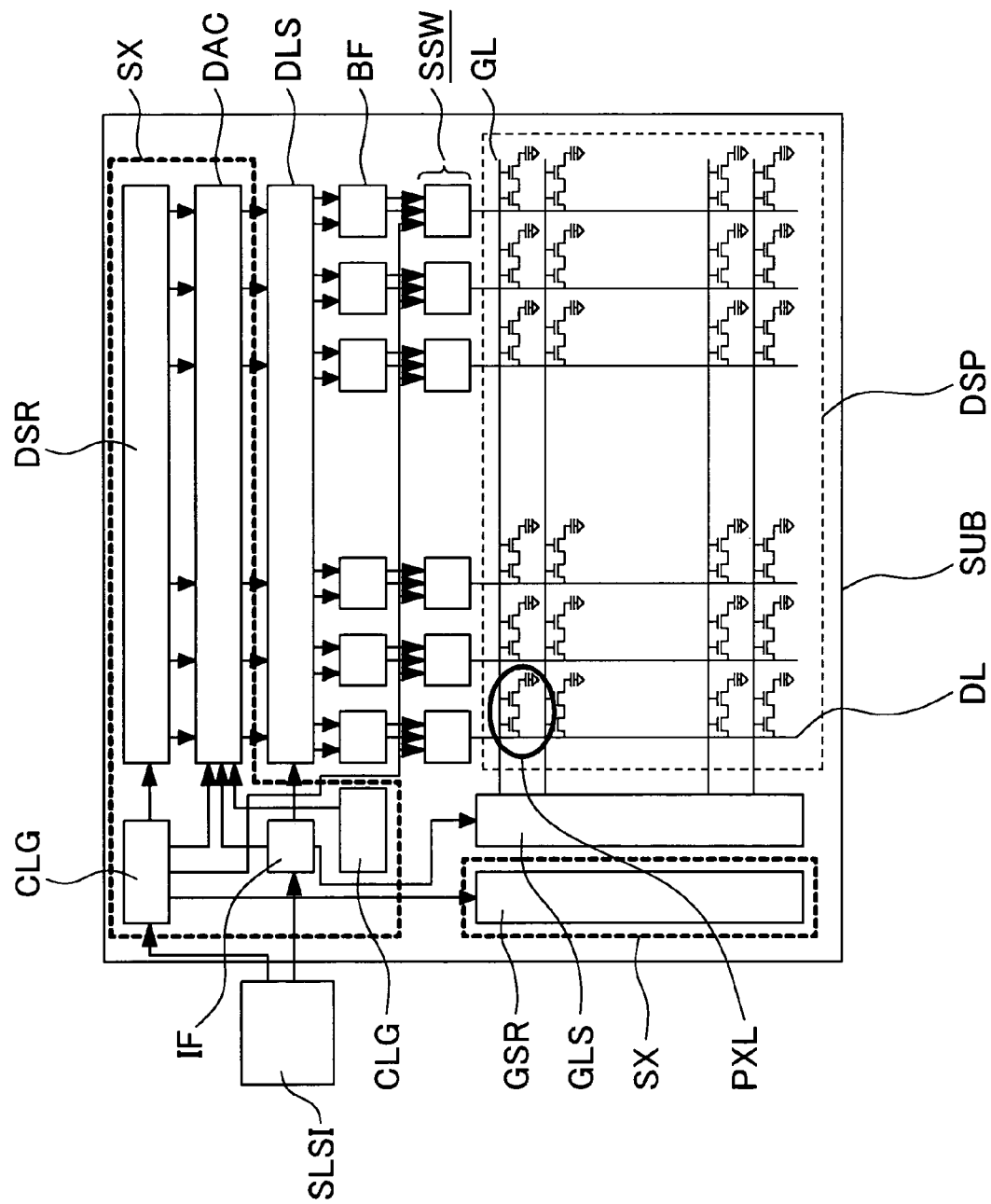
FIG. 1 is a plan view schematically illustrating an outline of an image section, a pixel-driving circuit section and other necessary circuits fabricated on a glass substrate which serves as an active-matrix substrate constituting an image display device.

FIG. 1 is a plan view schematically illustrating an outline of an image section, a pixel-driving circuit section and other necessary circuits fabricated on a glass substrate which serves as an active-matrix substrate constituting an image display device. In the case of a liquid crystal display device, a liquid crystal material is filled in a space between the active-matrix substrate and a counter substrate provided with color filters or the like thereon and attached to the active-matrix substrate by an adhesive. The counter substrate provided with color filters are called the color filter substrate.

Here consider a case in which the active-matrix substrate is adapted for the image display device of the line at-a-time scanning type. A major portion of the glass substrate SUB is occupied by a pixel region DSP. A plurality of pixels PXL are arranged in a matrix fashion in the pixel region DSP, and each of the pixels PXL is disposed at an intersection of one of data lines DL and one of gate lines GL. Each of the pixels PXL is comprised of a TFT serving as a switch and a pixel electrode. In this example, the switch is illustrated as a double gate comprised of two TFTs, but the switch may be comprised of a single gate or a multiple gate.

Disposed outside the pixel region DSP on the glass substrate SUB are driving circuit regions formed with circuits for supplying driving signals to a large number of pixels PXL fabricated within the pixel region DSP.

Disposed along one of the long sides of the pixel region DSP (at the top side in FIG. 1) are a shift register DSR which functions for display data in digital form to be read into a digital-to-analog converter DAC successively, the digital-to-analog converter DAC for outputting the digital display data as gray scale signals, a level shifter DLS for producing desired gray scale voltages by amplifying the gray scale signals from the digital-to-analog converter circuit DAC, buffers BF, and sampling switches SSW which function to apply gray scale voltages of opposite polarities to adjacent ones of the pixels PXL.

On the other hand, disposed along one of the short sides of the pixel region DSP (at the left-hand side in FIG. 1) are a shift register GSR for opening the gates of the pixels PXL successively and a level shifter GLS. Disposed in the vicinities of the above-mentioned circuits are an interface IF for performing the signal conversion of image data transferred from a system LSI circuit SLSI, a gray scale signal generator circuit SIG, clock signal generator circuits CLG for generating clock signals used for timing control of the respective circuits, and the like.

Among the above-mentioned circuits, since the interface IF, the clock signal generator circuits CLG, the drain-side shift register DSR, the gate-side shift register GSR and the digital-to-analog converter circuit DAC handle digital signals, they are required to perform high-speed operation. Further, they are required to be driven at low voltages for reduction of power consumption.

On the other hand, the pixel PXL is a circuit for modulating light transmission through a liquid crystal layer by applying a voltage to the liquid crystal layer, and therefore they need to driven at high voltages for producing gray scale levels. Moreover, for retaining a signal voltage for a specified period of time, thin film transistors which perform switching operation need to have small leakage currents. Since the drain-side level shifter DLS, the gate-side level shifter GLS, the buffers BF and the sampling switches SSW are coupled between the low-voltage driving circuits and the high-voltage driving circuits, and they supply high-voltage analog signals to the pixels PXL, they are required to perform high-voltage driving operation. As explained above, in the case in which circuits for displaying of images are fabricated on the glass substrate SUB, plural TFTs having specifications conflicting with each other need to be fabricated on the same substrate.

FIG. 2 is a table summarizing specifications required for respective circuits fabricated in the respective driving circuit regions of the active-matrix substrate, and advantages obtained from the specifications. Since the specifications required for the circuits fabricated in the respective regions and the advantages obtained therefrom are described in the table of FIG. 2, their explanations are omitted here.

To meet the required specifications summarized in FIG. 2, in this example, by scanning and selectively irradiating pulse-modulated laser light on portions intended for the interface IF, the clock signal generator circuits CLG, the drain-side shift register DSR, the gate-side shift register GSR and the digital-to-analog converter circuit DAC shown in FIG. 1, discontinuous converted regions comprised of band-shaped-crystal silicon films are obtained which are converted such that crystalline grains have their grain boundaries continuous in the scanning direction of the laser light. These discontinuous converted regions are denoted by reference symbols SX in FIG. 1.

FIGS. 3A(1) to 3B(2) are schematic diagrams illustrating the manner in which an amorphous film is converted into a polycrystalline silicon film having good quality. FIG. 3A(1) is a perspective view of a substrate, and FIG. 3A(2) is a plan view of the substrate of FIG. 3A(1), as viewed from above the substrate of FIG. 3A(1). FIG. 3B(1) is a perspective view of a substrate, and FIG. 3B(2) is a plan view of the substrate of FIG. 3B(1), as viewed from above the substrate of FIG. 3B(1).

As shown in FIGS. 3A(1) and 3A(2), a precursor film PRC and an amorphous silicon film ASI are formed over an entire area on an insulating substrate INS by a chemical vapor deposition method (a CVD method). The precursor film PRC is not necessarily formed, depending upon the kind of the insulating film. In this example, the precursor film PRC is provided.

The deposited amorphous silicon film ASI is converted into a polycrystalline silicon film PSI by irradiating excimer laser light EXL over an entire area of the amorphous silicon film ASI. This conversion is processing of an amorphous state into a crystalline state. The polycrystalline silicon film PST1 may be formed directly by using a chemical vapor deposition method (a CVD method) or a sputtering method.

Next, as shown in FIGS. 3B(1) and 3B(2), formed by scanning in a specified direction SSLD and selectively irradiating pulse-modulated laser light or quasi-CW laser light SSL from solid-state laser on regions of the polycrystalline silicon film PSI corresponding to the regions denoted by reference symbol SX in FIG. 1, are discontinuous converted regions VTL comprised of even band-shaped-crystal polycrystalline silicon films formed of crystalline grains having their grain sizes extended in the scanning direction of the laser light and uniform crystalline grain widths in a direction perpendicular to the scanning direction of the laser light. This conversion is processing of enlarging polycrystalline grain sizes.

It is not always necessary that the scanning direction EXLD of the excimer laser light EXL is coincident with the scanning direction SSLD of the pulse-modulated laser light or quasi-CW laser light SSL from solid-state laser.

In the following, the rectangular discontinuous converted region VTL obtained by the above-mentioned method will also be called the virtual tile for convenience' sake.

The size of the virtual tile VTL is determined by the scale of a circuit to be fabricated within the virtual tile VTL, or the size required for plural circuits to be fabricated within the virtual tile VTL.

Figure 4A:
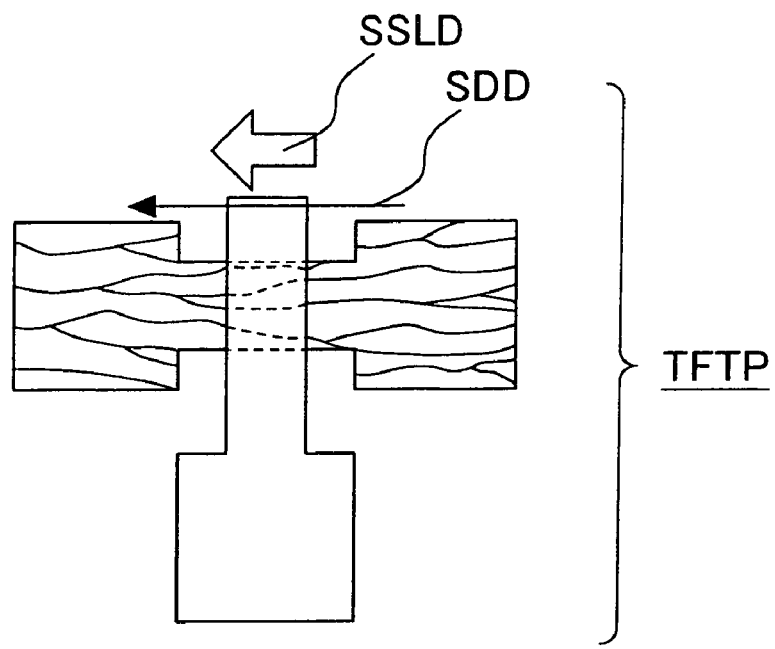
FIGS. 4A and 4B are plan views schematically illustrating relationships among a layout of a thin film transistor, scanning directions of solid-state laser light and grain boundaries.
Figure 4B:
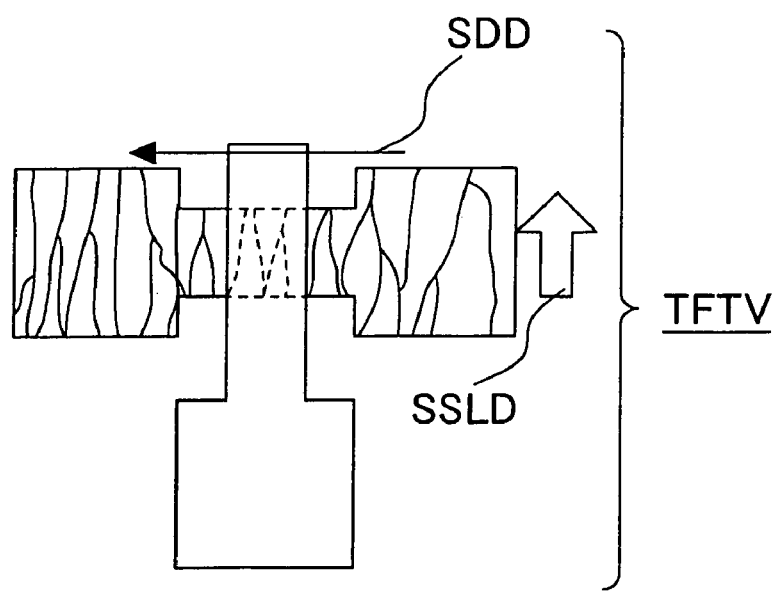

FIGS. 4A and 4B are plan views schematically illustrating relationships among a layout of a thin film transistor, the scanning directions of solid-state laser light and grain boundaries. The thin film transistors of the circuits within the regions SX of FIG. 1 are fabricated by using the above-explained method.

In a case in which the scanning direction SSLD of the pulse-modulated laser light or quasi-CW laser light SSL from solid-state laser is selected to be parallel with a source-to-drain direction SDD of a thin film transistor TFTP as shown in FIG. 4A, since the number of times electrons are scattered at crystalline grain boundaries is small, electron mobility is as high as 300 $cm^2/V \cdot s$ to 500 $cm^2/V \cdot s$, and variations in threshold voltage are within ±0.2 V.

On the other hand, in a case in which the scanning direction SSLD of the pulse-modulated laser light or quasi-CW laser light SSL from solid-state laser is selected to be perpendicular to a source-to-drain direction SDD of a thin film transistor TFTV as shown in FIG. 4B, electron mobility becomes as low as 100 $cm^2/V \cdot s$ to 300 $cm^2/V \cdot s$, but, since the resistance is increased, an OFF-current is small, little degradation in characteristics occurs, the transistor exhibits high withstand-voltage transistor characteristics.

Figure 5:
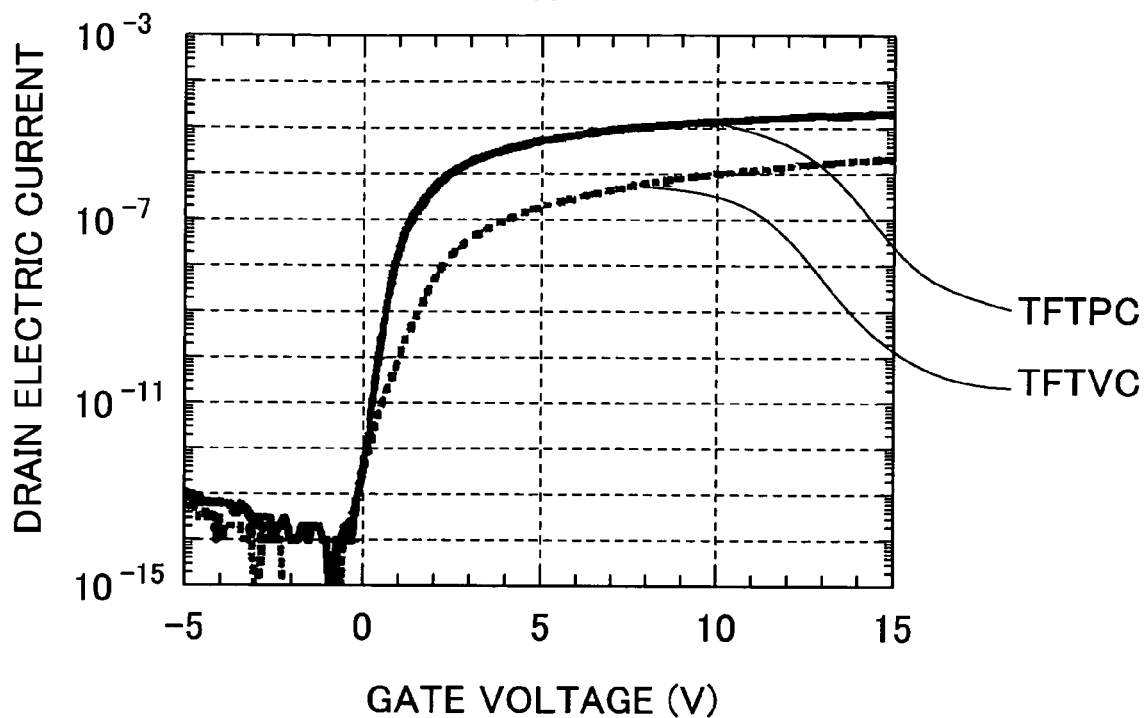
FIG. 5 is a graph showing a comparison in transfer characteristic between two different layouts of transistors fabricated within virtual tiles VTL.

FIG. 5 is a graph showing a comparison in transfer characteristic between two different layouts of transistors fabricated within the virtual tiles VTL. Curves TFTPC and TFTVC in FIG. 5 show the transfer characteristics of the transistors TFTP, TFTV of FIGS. 4A and 4B, respectively. Therefore, they can be used as elements for retaining, discharging and storing charges, for example, memory switches.

The above-explained thin film transistors make it possible to mount the high-speed circuits (mainly the pixel-driving circuits) which have conventionally been mounted in the form of LSI chips around the image section (the display area) of the glass substrate, directly on the same glass substrate. This makes it possible to reduce the cost of LSI chips, and the area of non-displaying region at the periphery of the panel (the peripheral portion of the active-matrix substrate). Further, conventionally, custom-tailoring of circuits has been performing at the design and fabrication of LSI chips, but the present invention makes it possible to custom-tailor the circuits at the time of fabricating a panel intended for an active-matrix substrate.

In the following, actual exemplary layouts on actual substrates will be explained by reference to FIGS. 6 to 9.

Figure 6:
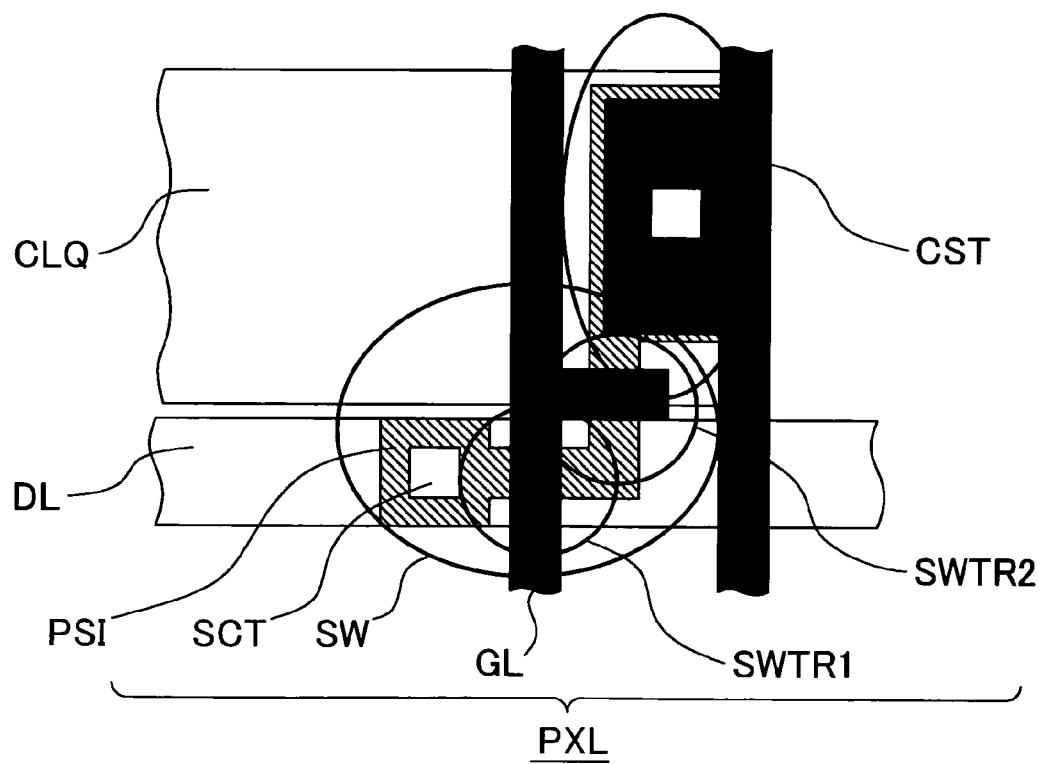
FIG. 6 is a plan view of a principal portion for illustrating an example of a layout of a pixel on an insulating substrate in an example of the present invention.

FIG. 6 is a plan view of a principal portion for illustrating an example of a layout of a pixel on an insulating substrate in an example of the present invention. The pixel PXL in the pixel region DSP shown in FIG. 1 is comprised of a switch SW formed of thin film transistors for retaining, discharging and storing charges, a storage capacitance CST, and a pixel electrode CLQ, a source-side end of the switch SW is connected to a drain line DL via a contact SCT, a drain-side end of the switch SW is connected to the storage capacitance CST, and a gate of the switch SW is connected to a gate line.

If the switch SW is in an ON state, a gray scale signal transferred to the drain line DL is transferred to the storage capacitance CST and the pixel electrode CLQ connected to the storage capacitance CST via a contact ICT in the form of an electrical charge. Then, if the switch SW is turned in an OFF state, the electrical charge is retained, and thereafter, if the switch SW is turned into an ON state again, the electrical charge is discharged into the drain line DL, and then the pixel is reset.

The switch SW has a double-gate structure comprised of two thin film transistors SWTR1 and SWTR2 so as to improve withstand voltages. Although, in this example, the switch SW is illustrated as having the double-gate structure, the improvement on withstand voltages can also be realized by adopting a switch comprised of one or two thin film transistors having an LDD (Lightly Doped Drain) structure to be explained subsequently. The elements constituting the pixel PXL are fabricated from the above-explained polycrystalline silicon film PSI converted from amorphous silicon by using excimer laser. Consequently, no anisotropy is present in the polycrystalline silicon film, and as a result, regardless of what the layout of a thin film transistor is, there is little difference in characteristics of the thin film transistor.

Therefore, in this example, for the purpose of reducing an area of the layout and improving the aperture ratio of the pixel, it is desirable that the source-to-drain directions of the two thin film transistors SWTR1 and SWTR2 are selected to be perpendicular to each other in the layout.

As in the case of the pixels PXL, constituent elements of the sampling switches SSW, the drain-side level shifter DLS, the gate-side level shifter GLS, and the buffers BF are fabricated from the polycrystalline silicon film PSI explained in connection with FIGS. 3A(1) to 3B(2). Therefore, it is desirable that the source-to-drain directions of some of thin film transistors constituting the above-mentioned circuits are selected to be perpendicular to each other in the layout.

Figure 7:
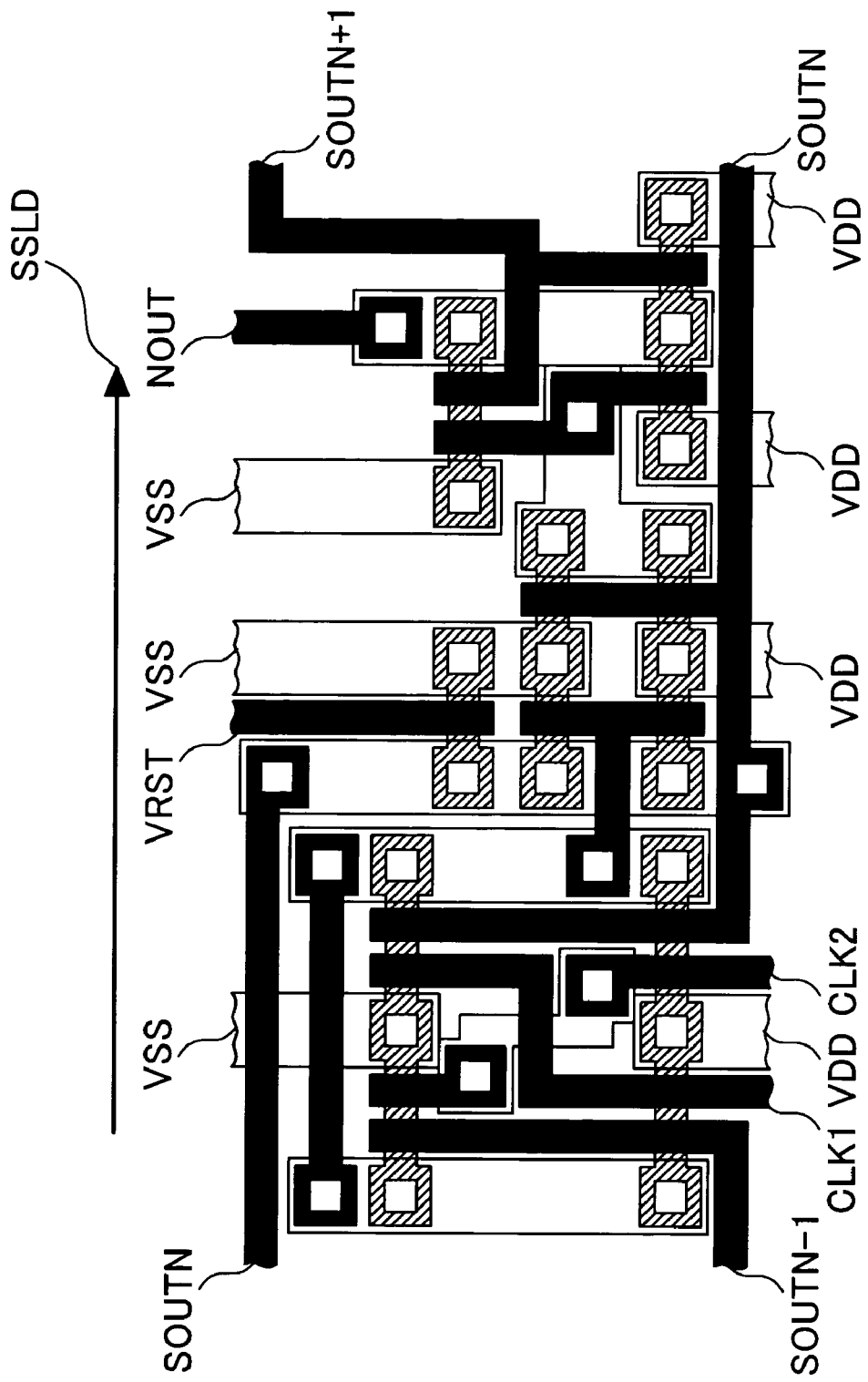
FIG. 7 is a plan view of a principal portion for schematically illustrating an example of a layout of one stage constituting a drain-side shift register DSR on the substrate.
Figure 8:
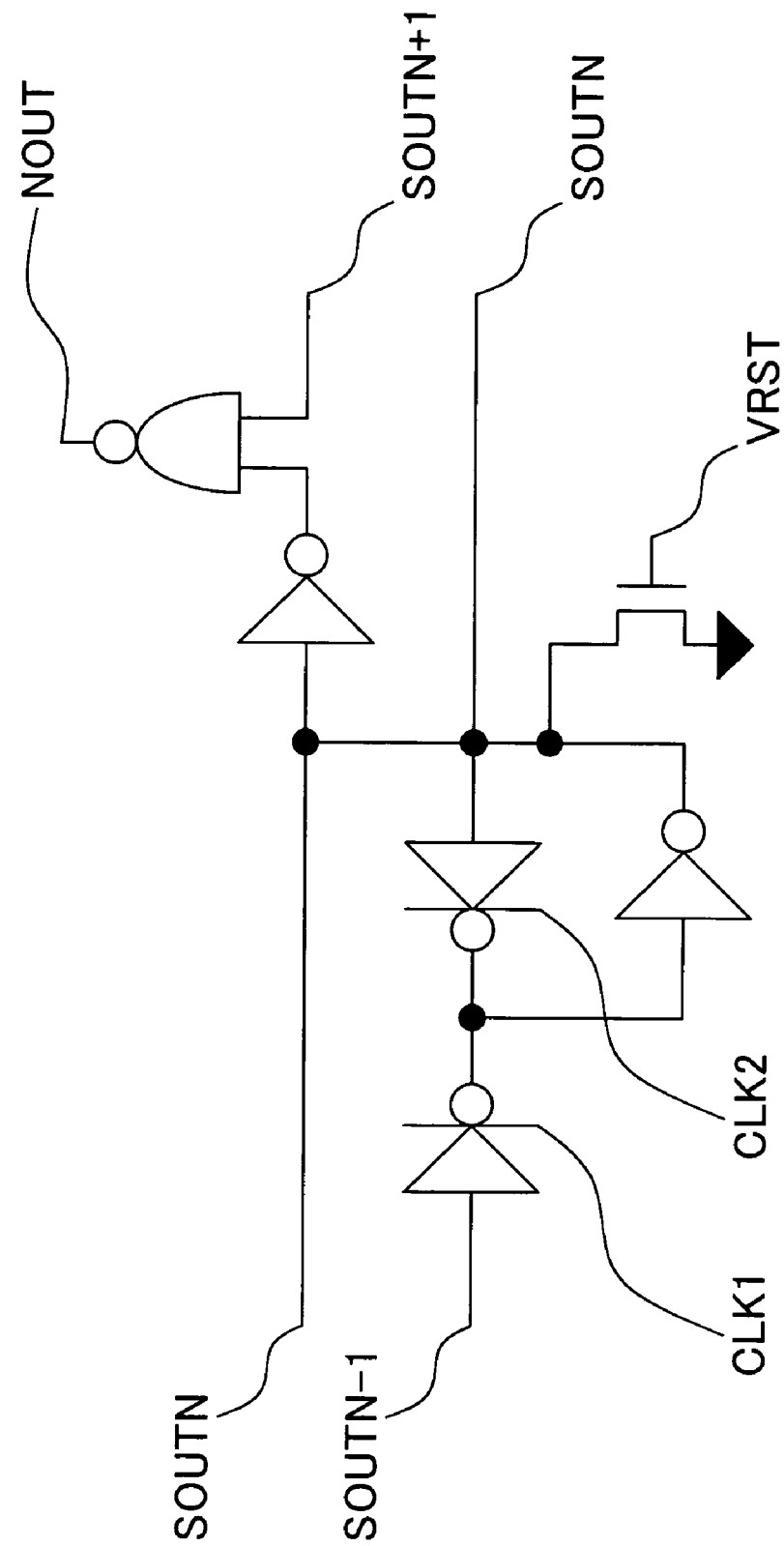
FIG. 8 is a circuit diagram of a logic circuit corresponding to one stage constituting the drain-side shift register DSR.
Figure 9:
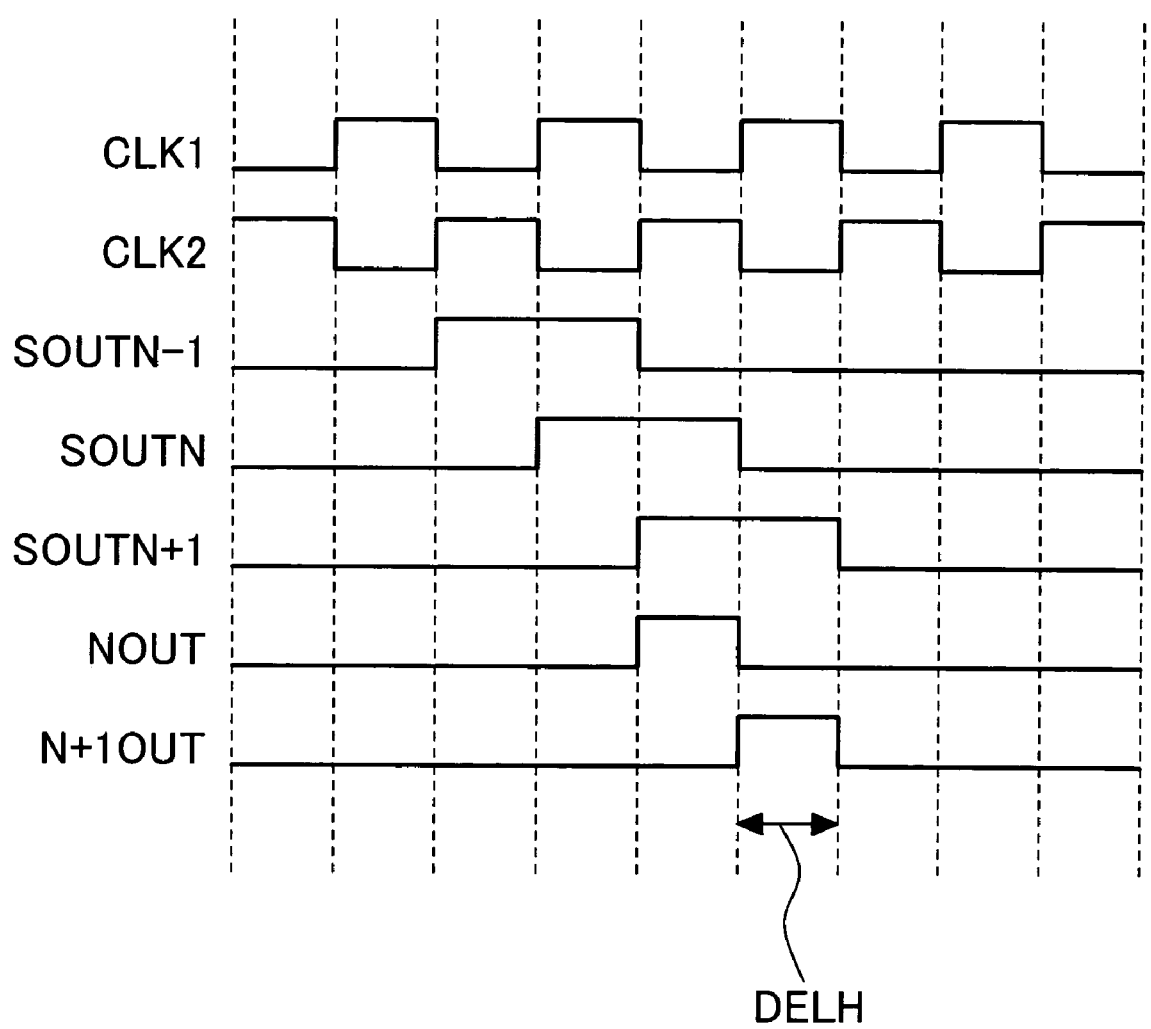
FIG. 9 is a timing chart for explaining operation of the shift register DSR shown in FIG. 7.

FIG. 7 is a plan view of a principal portion for schematically illustrating an example of a layout of one stage constituting the drain-side shift register DSR on the substrate. FIG. 8 is a circuit diagram of a logic circuit corresponding to the one stage constituting the drain-side shift register DSR. FIG. 9 is a timing chart for explaining operation of the shift register DSR shown in FIG. 7.

Usually the shift register constituting a driving circuit of an image display device is comprised of a number M of stages. Here consider an Nth one of the M stages for convenience' sake. A signal SOUTN-1 outputted from the (N−1)th stage of the shift register is outputted as a signal SOUTN via two clocked inverters. Clock signals for the (N+1)th stage are changed to those for the Nth stage, and by controlling the clock signals CLK1 and CLK2 as indicated in the timing chart of FIG. 9, the rising time of signals at the respective stages can be shifted. As a result, timing at which display data are transferred to a gate of a thin film transistor or a drain line can be shifted by a time DELH successively for each of the pixels.

The circuit of the shift register DSR can be realized in various ways, and when a circuit configuration shown in FIG. 8 is adopted, the number of elements constituting the circuit can be reduced, but the rising and falling of the signals need to be steep.

The constituent elements of the drain-side shift register DSR are fabricated within the virtual tile VTL shown in FIGS. 3B(1) and 3B(2). This circuit is required to perform high-speed operation, and therefore it is desirable that the source-to-drain direction of all the thin film transistors is selected to be parallel with the scanning direction SSLD of the pulse-modulated laser light or quasi-CW laser light SSL from solid-state laser in the layout.

Further, as in the case of the drain-side shift register DSR, the interface IF, the clock signal generator circuits CLG, the gate-side shift register GSR and the digital-to-analog converter circuit DSC are fabricated within the virtual tiles VTL. Therefore, it is desirable that the source-to-drain directions of all the thin film transistors constituting these circuits are selected to be parallel with the scanning direction of the pulse-modulated laser light or quasi-CW laser light SSL from solid-state laser in the layout.

Further, it is an object of the present invention to provide an optimum layout for an arbitrary circuit specification, and therefore the present invention is not limited to the driving system and circuit arrangement as described in the above-described example, but are applicable to other driving systems and circuit arrangements. For example, consider a digital-to-analog converter circuit provided with memories. As explained previously, for the elements for retaining, discharging and storing electric charges, it is desirable to adopt the thin film transistors having a layout in which the thin film transistors are arranged perpendicularly to the scanning direction of the pulse-modulated laser light or quasi-CW laser light SSL from solid-state laser. That is to say, in this case, it is desirable that the thin film transistors serving as the switching elements for memories are arranged to be perpendicular to the scanning direction SSLD of the pulse-modulated laser light or quasi-CW laser light SSL, and that the other constituent thin film transistors of the digital-to-analog converter circuit are arranged to be parallel with the scanning direction SSLD. Similarly, among the high-speed circuits fabricated within the virtual tiles VTL, a circuit including a thin film transistor for retaining, discharging and discharging charges, such as a memory, is configured such that only this thin film transistor is arranged perpendicularly to the remainder of the transistors constituting the circuit.

Figure 10:
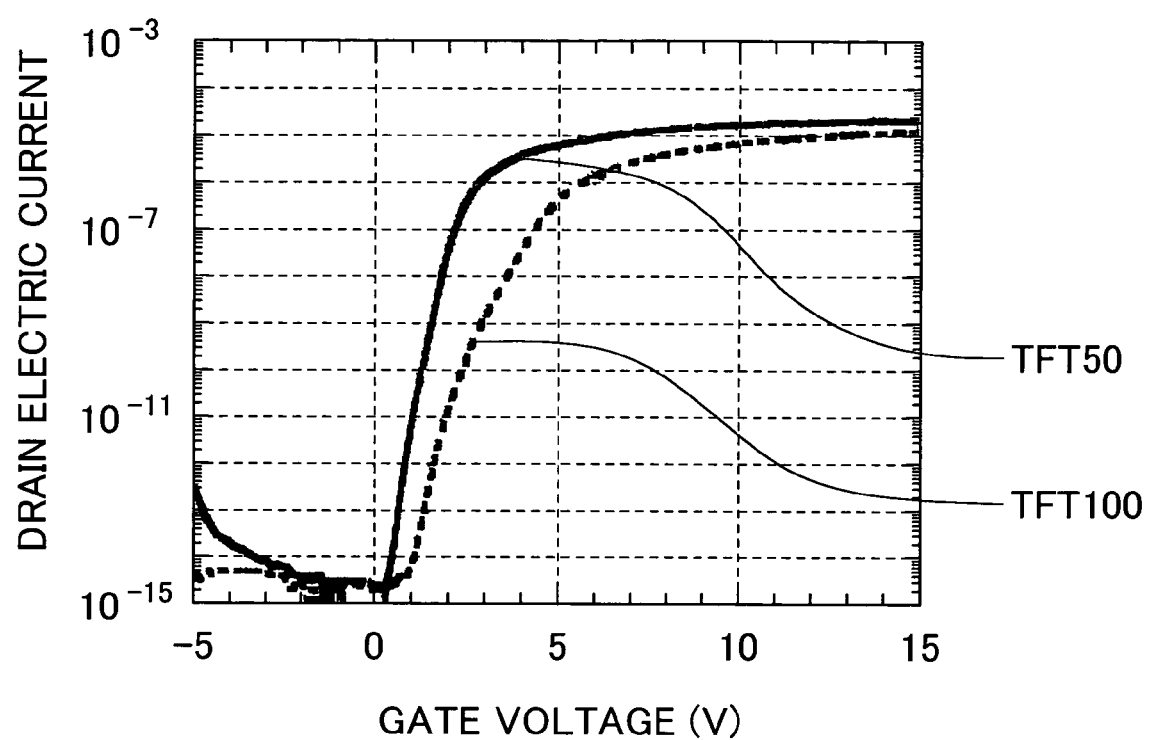
FIG. 10 is a graph showing a difference in characteristics due to a difference in film thickness between silicon oxide films used as gate insulating films by plotting drain currents against gate voltages.

The optimum structure is selected for a thin film transistor according to its circuit specification. For example, it is known that transistor performances are improved and their variations are reduced by thinning a gate insulating film of a thin film transistor or using a insulating film of a high dielectric constant as the gate insulating film. FIG. 10 shows a difference in characteristics due to a difference in film thickness between silicon oxide films used as gate insulating films by plotting drain currents against gate voltages. As is apparent from FIG. 10, curve TFT50 for a silicon oxide film thickness of 50 nm exhibits better rising characteristics and larger currents compared with curve TFT100 for a silicon oxide film thickness of 100 nm. Therefore, by way of example, the circuit performance can be improved further by using thin film transistors of a thin gate insulating film for low-voltage high-speed circuits such as the shift registers, the digital-to-analog converter circuit and the interface, and by using thin film transistors of a thick gate insulating film for the remainder of the circuits.

Figure 11A:
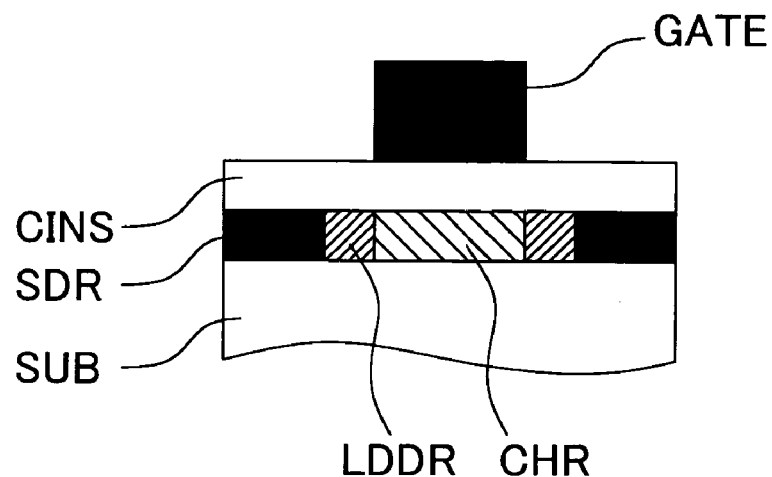
FIGS. 11A and 11B are schematic cross-sectional views of thin film transistor structures in one case in which impurity-injected layers of low concentration are present in boundaries between a channel region and a source region and between the channel region and a drain region, and in another case in which a gate is disposed over impurity-injected layers of low concentration, respectively.
Figure 11B:
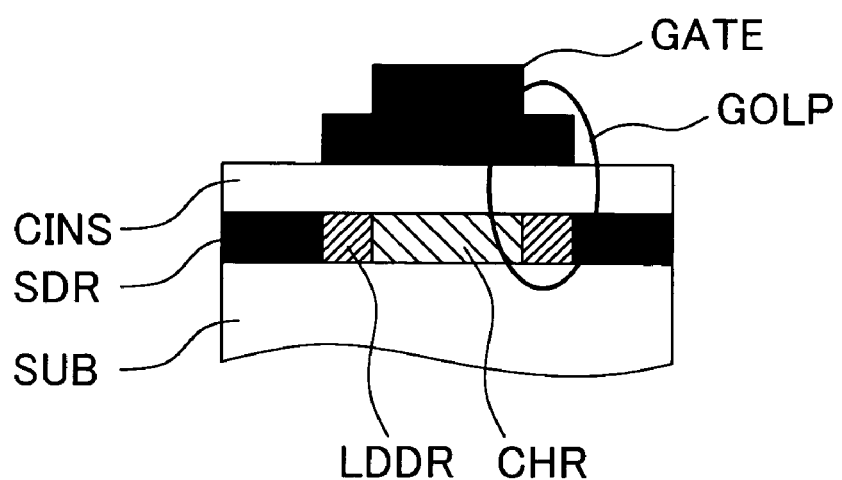

FIGS. 11A and 11B are schematic cross-sectional views of thin film transistor structures in one case in which impurity-injected layers of low concentration are present in boundaries between a channel region and a source region and between the channel region and a drain region, and in another case in which a gate is disposed over impurity-injected layers of low concentration, respectively. FIG. 11A illustrates the case in which the impurity-injected layers of low concentration are present in boundary regions between the channel region and the source region and between the channel region and the drain region, and FIG. 11B illustrates the case in which the gate is disposed over the impurity-injected layers of low concentration.

In the case where the thin film transistor TFT is adopted which employs an LDD (Lightly Doped Drain) structure having the impurity-injected layers DDR of low concentration are present in boundary regions between the channel region CHR and the source and drain regions SDR as shown in FIG. 11A, although its performance deteriorates, an OFF-current can be suppressed which produces a parasitic transistor causing a problem in an ordinary transistor, and its reliability is also improved. Consequently, it is desirable to adopt the LDD structure in a circuit requiring a low leakage current, such as a pixel circuit; a circuit requiring a high withstand voltage and high reliability, such as a level shifter and a buffer; or a circuit required to avoid variations in a gray scale voltage caused by an increase in the Early voltage due to a parasitic bipolar operation, such as a gray-scale voltage generator circuit.

In the case where a GOLD (Gate Overlapped LDD) structure is adopted which has regions GOLD where the gate is formed over the LDD regions LDDR as shown in FIG. 11B, its performance is improved over the LDD structure, and its reliability is improved, and consequently, the circuit performance can be improved further.

Figure 12:
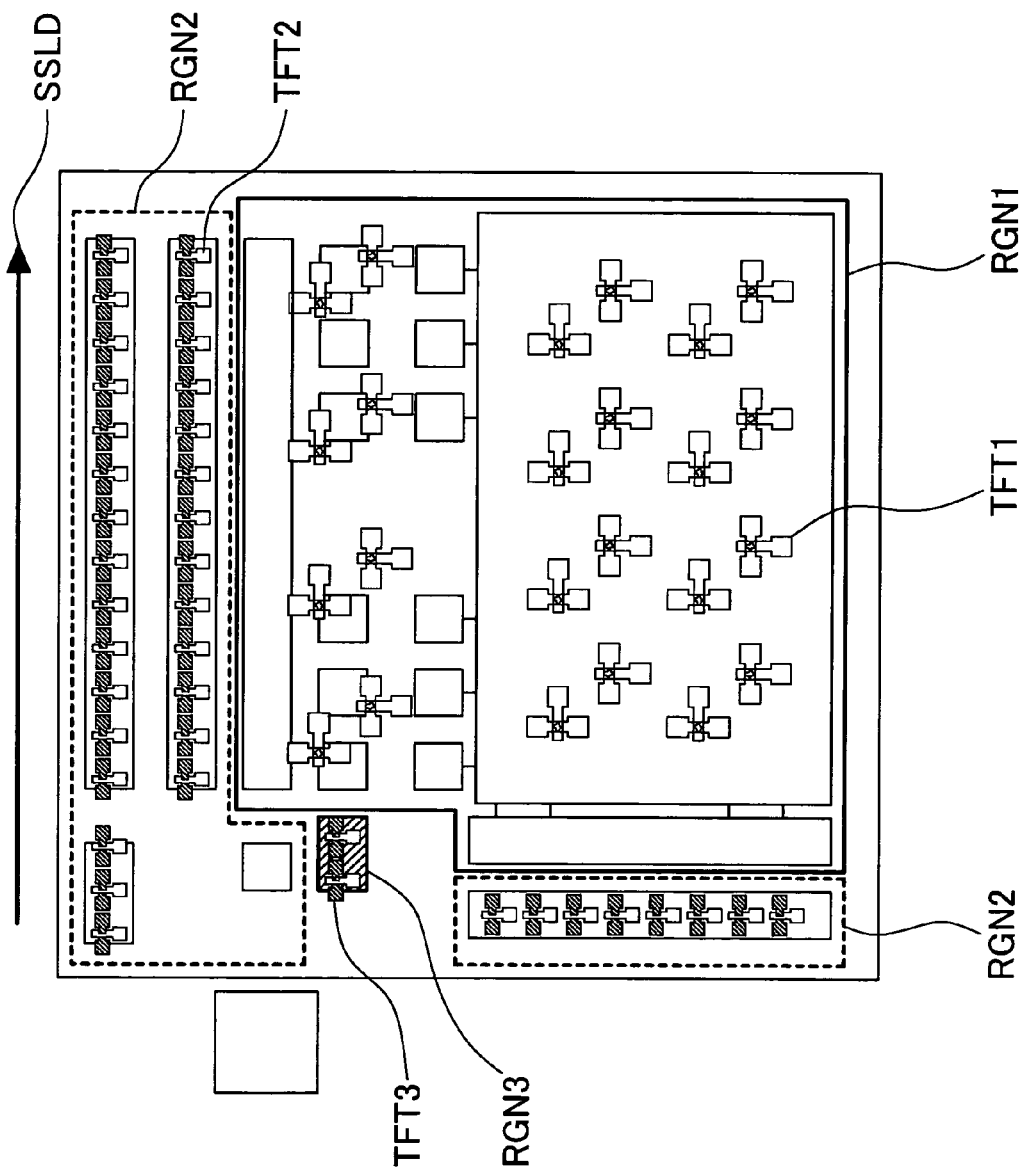
FIG. 12 is a plan view schematically illustrating a concept of another configuration example of an active-matrix substrate in accordance with the present invention.

In consideration of the above, the following explains an example of an active-matrix substrate constituting an image display device. FIG. 12 is a plan view schematically illustrating a concept of another configuration example of an active-matrix substrate in accordance with the present invention. The arrangement of the respective circuits in FIG. 12 is based on that shown in FIG. 1.

In a region RGN1 where pixels and circuits requiring high withstand voltages are mounted, some of the thin film transistors TFT1 constituting those circuits have their source-to-drain directions oriented in parallel with the scanning direction SSLD of the solid-state laser, and others have their source-to-drain directions oriented perpendicularly to the scanning direction SSLD. To be concrete, it is desirable that the thin film transistors TFT1 employ the above-explained LDD or GOLD structures.

In a region RGN2 where high-performance circuits are mounted, all the thin film transistors TFT2 constituting the circuits have their source-to-drain directions oriented in parallel with the scanning direction SSLD of the solid-state laser. To be concrete, the thin film transistors TFT2 may employ the LDD or GOLD structures, and if they are operated at low voltages, they do not need high withstand voltage, and therefore it is desirable that they employ a simple complementary MOS (Metal Oxide Semiconductor) structure. Further, it is desirable that the gate insulating film of the thin film transistors TFT2 is selected to be smaller in thickness than that of the thin film transistors TFT1, or that the gate insulating film of the thin film transistors TFT2 is fabricated from a material having a high permittivity.

In a region RGN3 where circuits for generating gray scale signals are mounted, all the thin film transistors TFT2 constituting the circuits have their source-to-drain directions oriented in parallel with the scanning direction SSLD of the solid-state laser. To be concrete, it is desirable that the thin film transistors TFT2 employ the LDD or GOLD structures to suppress the parasitic bipolar operation.

Fabrication of the thin film transistors in accordance with the present invention may be carried out by repeating well-known oxidation, film-formation and photolithography process steps with the above-explained layouts considered in circuit design. The only process special to the present invention is determination of positions of the virtual tiles VTL. The following explains a method of determining the positions of the virtual tiles VTL.

Figure 13A:
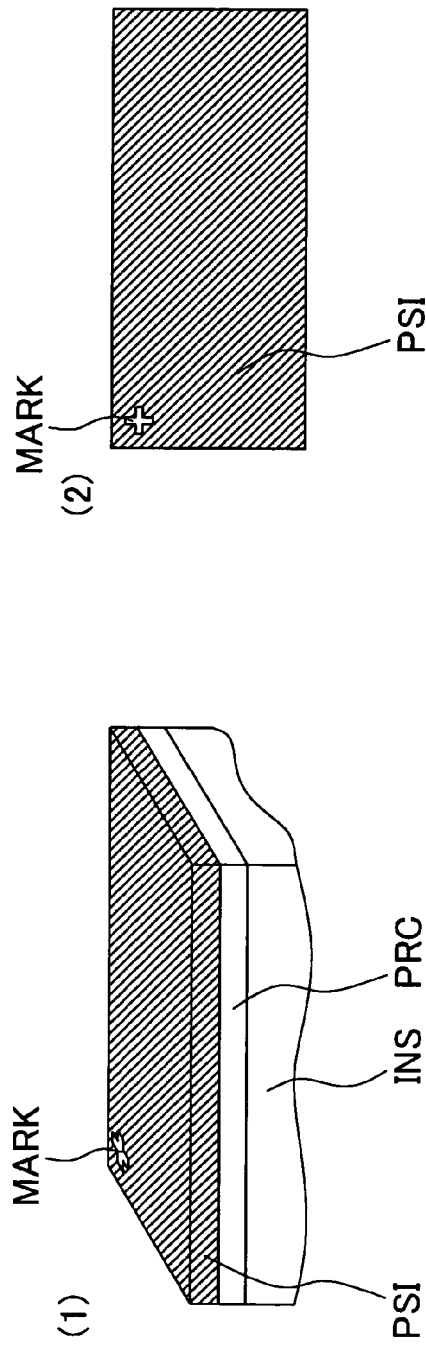
FIGS. 13A(1) to 13B(2) are illustrations for explaining a method of positioning regions to be irradiated by solid-state laser light for determining positions of virtual tiles VTL.

FIGS. 13A(1) to 13B(2) are illustrations for explaining the method of positioning regions to be irradiated by solid-state laser light for determining the positions of the virtual tiles VTL. FIG. 13A(1) is a perspective view illustrating formation of a positioning mark on a substrate, FIG. 13A(2) is a plan view of the substrate of FIG. 13A(1), as viewed from above, FIG. 13B(1) is a perspective view illustrating irradiation of laser light onto the substrate, and FIG. 13B(2) is a plan view of the substrate of FIG. 13B(1), as viewed from above.

In FIGS. 13A(1) and 13A(2), formed on a polycrystalline silicon film PSI by using a photolithographic method, a dry etching method, or laser, is a positioning mark MARK which serves as a target for determining a position to be irradiated by pulse-modulated laser light or quasi-CW laser light. Any of the above methods may be employed for formation of the positioning mark MARK, and when laser is used, the number of masks and the number of photolithgraphic process steps can be prevented from increasing.

Figure 13B:
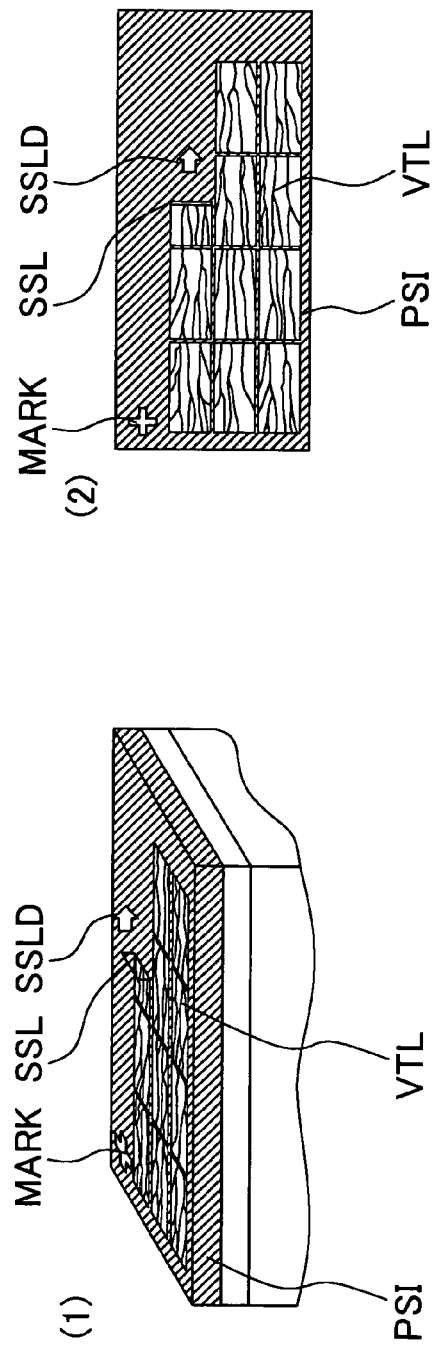

Then, as shown in FIGS. 13B(1) and 13B(2), the pulse-modulated laser light SXL are irradiated discontinuously onto the substrate by selecting specified regions VTL by using the mark MK as a reference point while the pulse-modulated laser light SXL is scanned in a direction SSLD. After discontinuous converted regions VTL comprised of band-shaped-crystal polycrystalline silicon films are fabricated by scanning and irradiating the pulse-modulated laser light SXL onto the regions VTL, well-known conventional fabrication steps for thin film transistors may be adopted.

Figure 14:
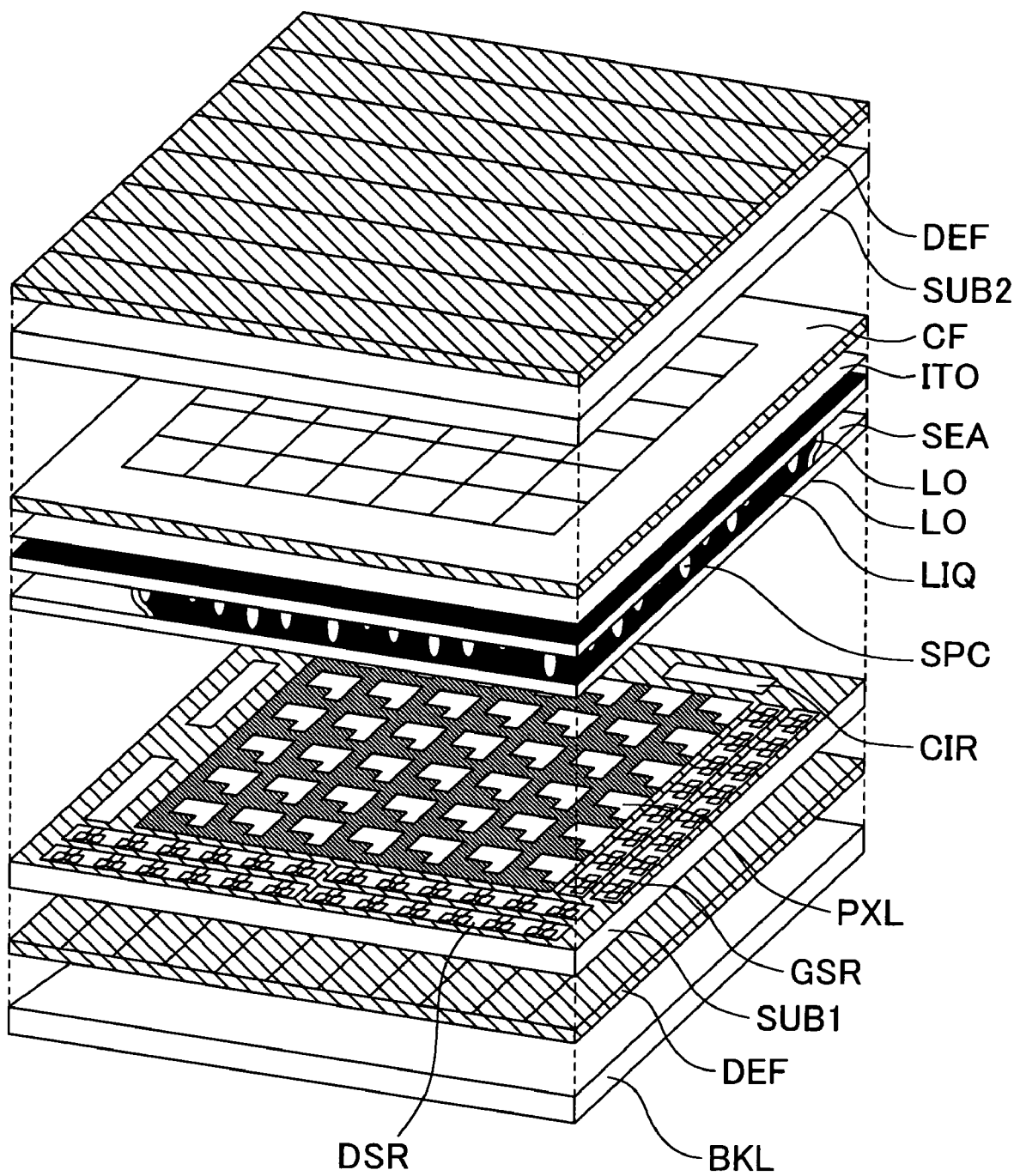
FIG. 14 is an exploded perspective view for schematically explaining a configuration example in which an image display device of the present invention is applied to a liquid crystal display device.

FIG. 14 is an exploded perspective view for schematically explaining a configuration example in which an image display device of the present invention is applied to a liquid crystal display device. Fabricated on a glass substrate SUB1 constituting an active-matrix substrate are a plurality of pixel electrodes PXL arranged in a matrix fashion, a drain-side circuit DSR and a gate-side driving circuit GSR for inputting display signals into the pixel electrodes, and a group of circuits CIR necessary for image display. Then an alignment layer LO is coated on the glass substrate SUB1 by using a printing method, and then a liquid-crystal aligning capability is imparted to the alignment layer LO as by using a rubbing method.

On the other hand, a color filter CF and a counter electrode ITO are fabricated on a counter substrate SUB2, and thereafter an alignment film LO is coated on the counter substrate SUB2, and then the liquid-crystal aligning capability is imparted to the alignment layer LO in the same way as above. The counter substrate SUB2 is attached to the glass substrate SUB1 with a spacing therebetween, then a liquid crystal material LIQ is filled between the opposing alignment layers LO by vacuum injection, and then the counter substrate SUB2 and the glass substrate SUB2 are sealed along their peripheries by using a sealing material SEA. In this case, spacers SPC interposed between the counter substrate SUB2 and the glass substrate SUB1 establish the spacing between the two substrates. In most cases, plastic beads or glass beads are used as the spacers. Instead, columnar spacers can be used which are fabricated on the counter substrate SUB2 or the glass substrate SUB1 by using photolithographic techniques.

Thereafter, a polarizer DEF is attached on a surface of each of the glass substrate SUB1 and the counter substrate SUB2. Then a liquid crystal display device is completed by attaching a backlight BKL behind the glass substrate SUB1.

Incidentally, although FIG. 14 illustrates the example in which a color filter is fabricated on the counter substrate SUB2, the present invention is equally applicable to a liquid crystal display device of the type having a color filter fabricated on the glass substrate SUB1 which serves as an active-matrix substrate.

Figure 15:
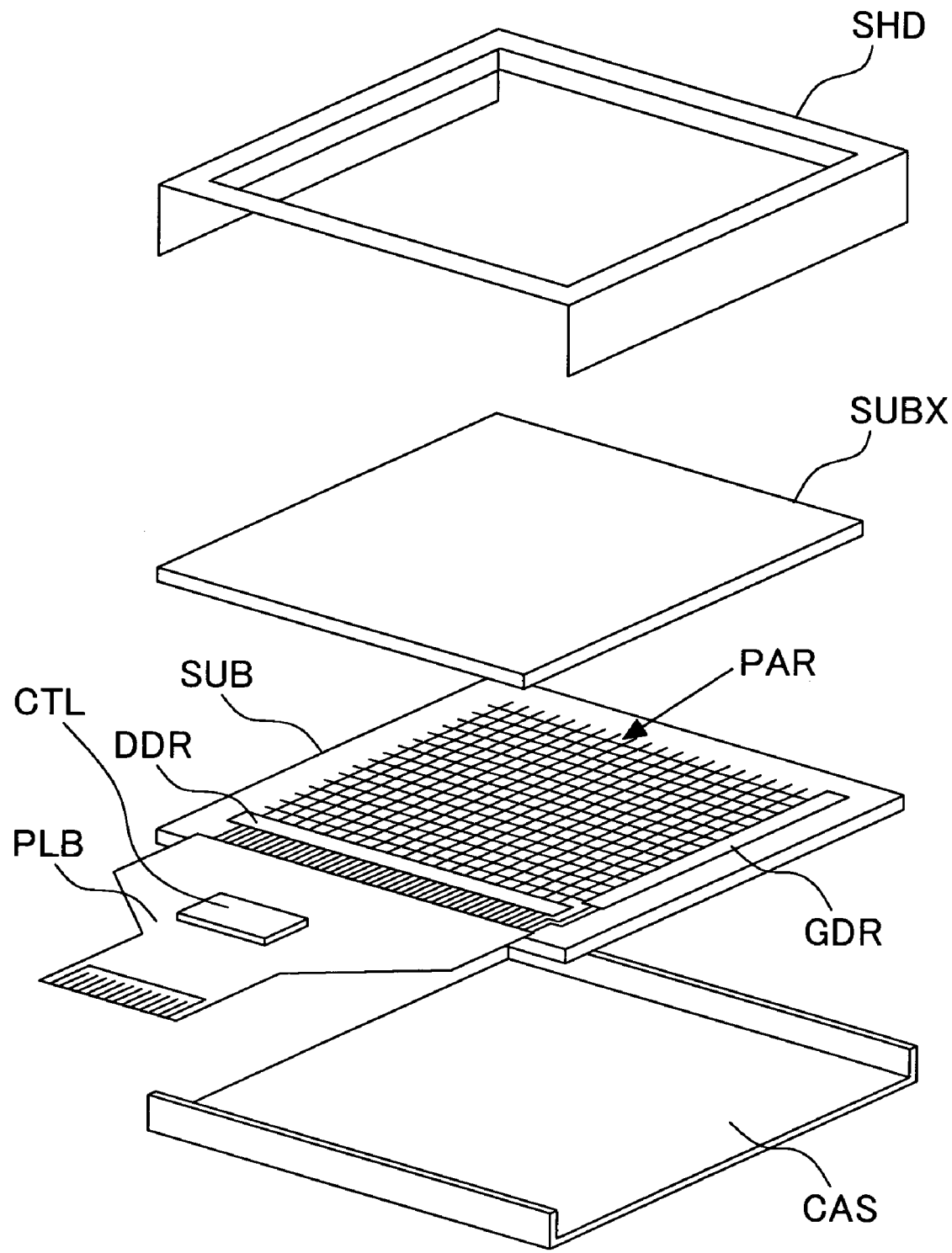
FIG. 15 is an exploded perspective view illustrating a configuration example in which an image display device of the present invention is applied to an organic EL display device.
Figure 16:
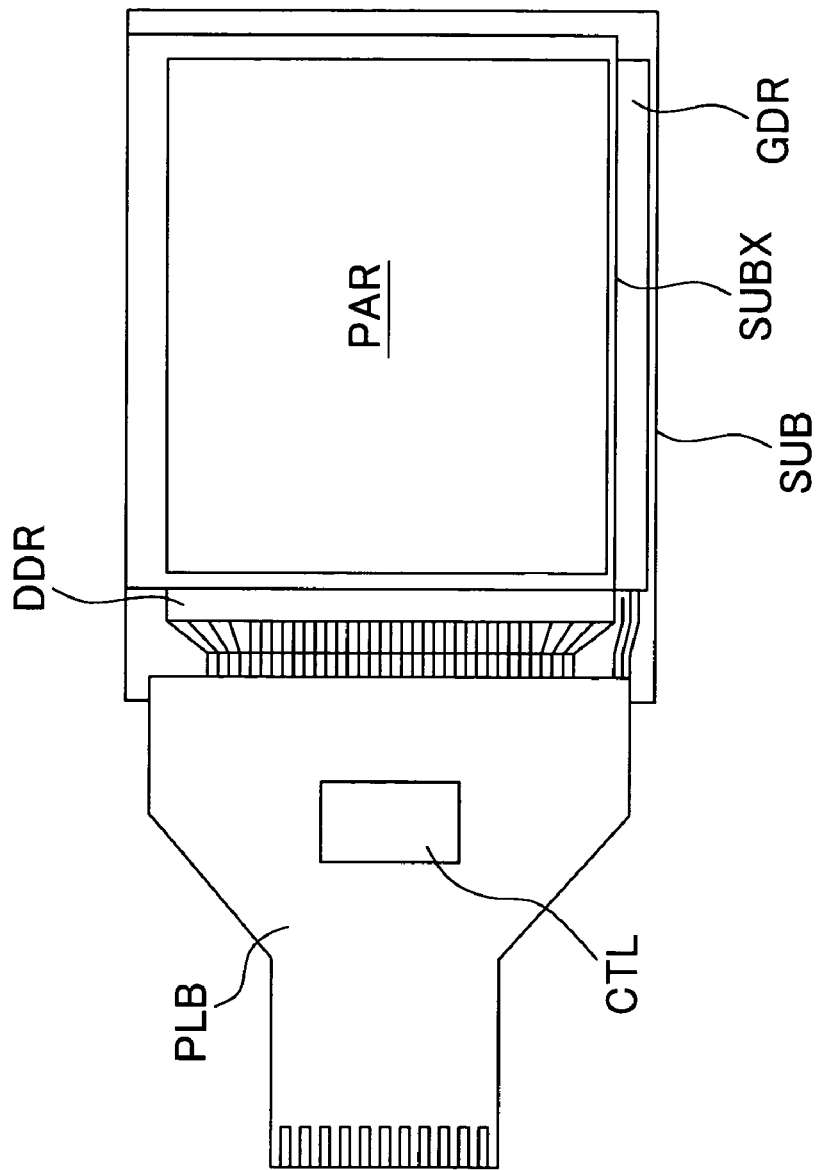
FIG. 16 is a plan view of the organic EL display device obtained by assembling the constituent elements shown in FIG. 15.

Further, an organic EL display device can also be fabricated by using the active-matrix substrate explained in connection with FIGS. 1 to 13(b-2). FIG. 15 is an exploded perspective view illustrating a configuration example in which an image display device of the present invention is applied to an organic EL display device. FIG. 16 is a plan view of the organic EL display device obtained by assembling the constituent elements shown in FIG. 15.

An organic EL element is fabricated on each of the pixel electrodes on the active-matrix substrate SUB explained in the above-described example. The organic EL element is formed of a stack of successively evaporated layers comprising a hole transport layer, a light-emitting layer, an electron transport layer, and a cathode metal layer from a surface of the pixel electrode in the order named. Each of the organic EL elements is provided with a pixel circuit formed of thin film transistor circuits (not shown). A driving circuit section DDR and a scan-driving circuit section GDR are fabricated outside of a pixel region PAR. The driving circuit section DDR and the scan-driving circuit section GDR are supplied with display signals and scan signals from an external signal source via a flexible printed circuit board PLB. The driving circuit section DDR and the scan-driving circuit section GDR are formed of the above-explained thin film transistors. An integrated circuit constituting a display control device CTL is mounted on the flexible printed circuit board PLB.

The active-matrix substrate SUB provided with the above-mentioned stack of the evaporated layers is sealed by using a sealing substrate SUBX or a sealing can with a sealing material disposed around the pixel region PAR. An organic EL display device is completed by combining the active-matrix substrate SUB with a shield frame SHD which serves as an upper case and a lower case CAS, in an integral structure.

In active-matrix driving of the organic EL display device, since the organic EL element is of the current-driven light emission type, the adoption of high-performance pixel circuits is essential for providing a high-quality image, and it is desirable to employ pixel circuits formed of CMOS type thin film transistors. Further, the thin film transistor circuits fabricated in the driving circuit regions are indispensable for realizing high-speed operation and a high-definition display. The active-matrix substrate SUB in this example has high performances capable of meeting such requirements. The organic EL display device employing the active-matrix substrate of this example is one of the display devices capable of making the most of the advantages of this example.

The present invention is not limited to the display devices employing the above-described active-matrix substrates, the configurations defined in claims of this specification, or the configurations explained in the embodiments of this specification, but various changes and modifications may be made without departing from the sprit of the present invention, and for example, the present invention can be applied to various kinds of semiconductor devices.

FIGS. 17 to 20 illustrate exemplary display devices to which the present invention is applied.

Figure 17:
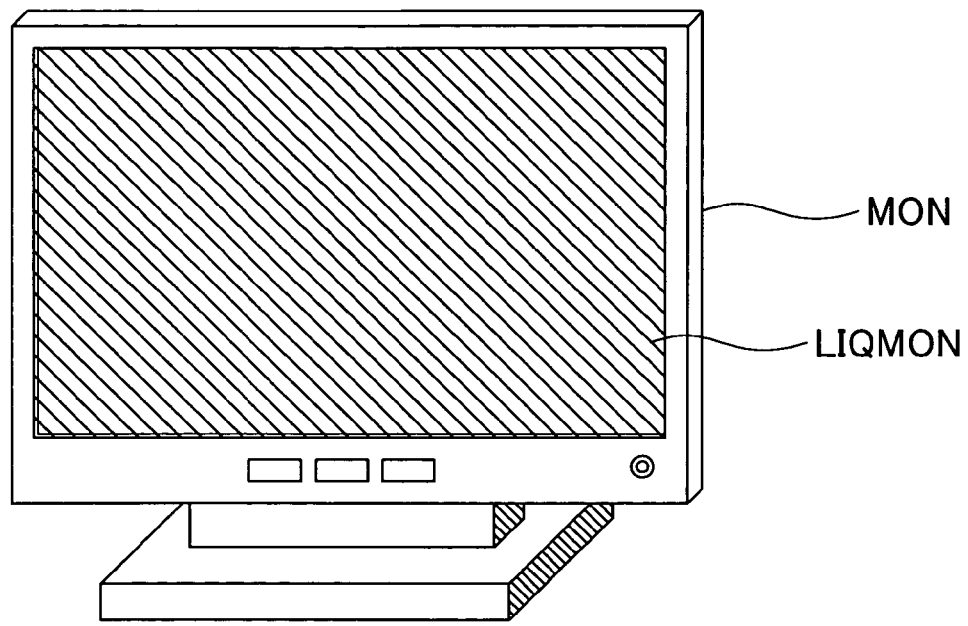
FIG. 17 is an external view of an example in which an image display device of the present invention is incorporated into a display section of a personal computer or a TV receiver.

FIG. 17 is an external view of an example in which an image display device of the present invention is incorporated into a display section of a personal computer or a TV receiver, and in which a liquid crystal display device LIQMON of the present invention is employed in a display section MON of the personal computer or the TV receiver.

Figure 18:
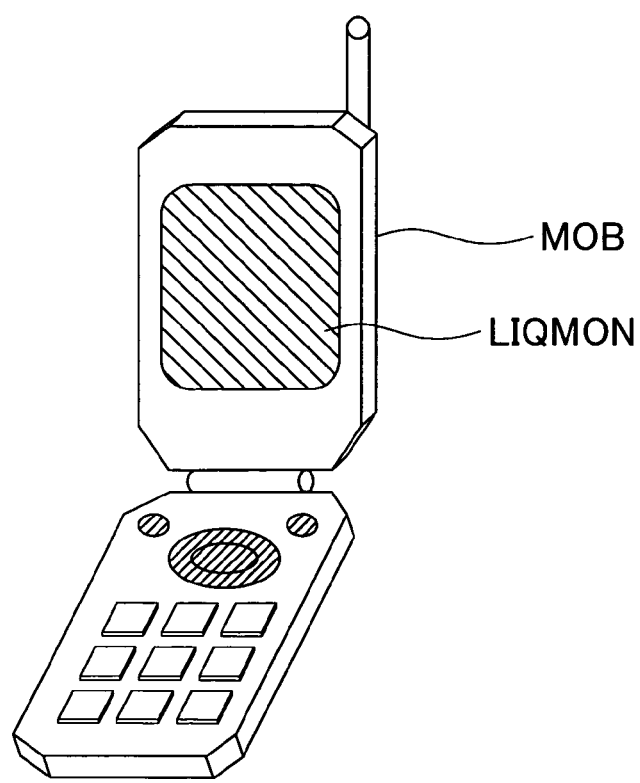
FIG. 18 is an external view of an example in which an image display device of the present invention is incorporated into a display section of a mobile phone.

FIG. 18 is an external view of an example in which an image display device of the present invention is incorporated into a display section of a mobile phone, and in which a liquid crystal display device LIQMON of the present invention is employed in a display section MOB of the mobile phone.

Figure 19:
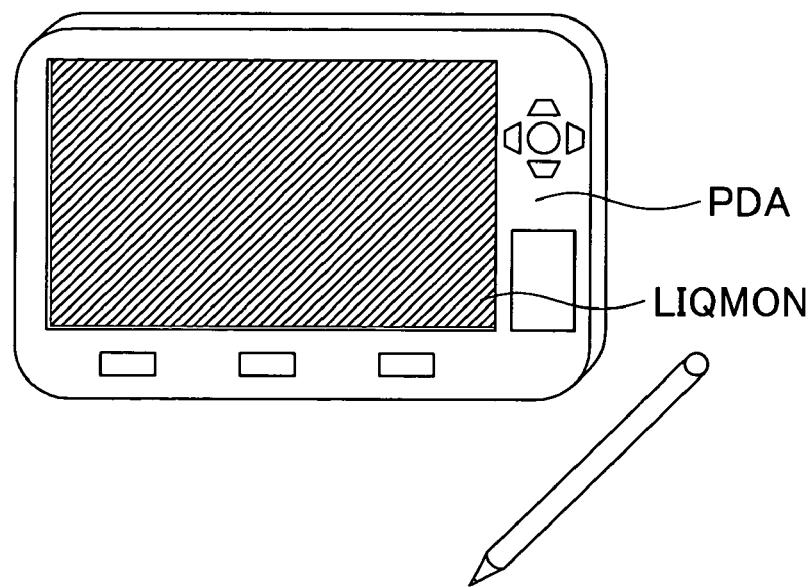
FIG. 19 is an external view of an example in which an image display device of the present invention is incorporated into a display section of a portable digital terminal.

FIG. 19 is an external view of an example in which an image display device of the present invention is incorporated into a display section of a portable digital terminal, and in which a display device LIQMON of the present invention is employed in a display section of the portable digital terminal PDA.

Figure 20:
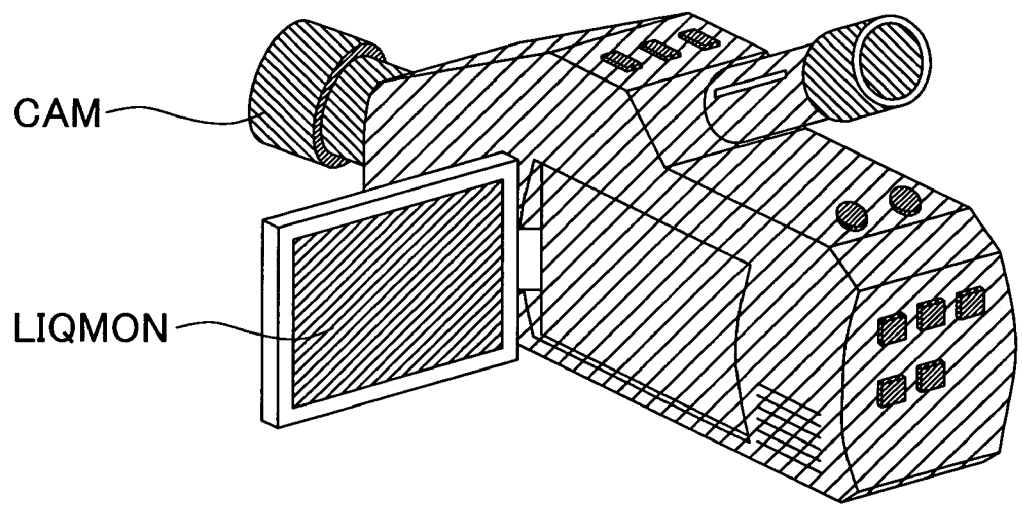
FIG. 20 is an external view of an example in which an image display device of the present invention is incorporated into a display section of a video camera.

FIG. 20 is an external view of an example in which an image display device of the present invention is incorporated into a display section of a video camera, and in which a display device LIQMON of the present invention is employed in a viewfinder section of the video camera CAM.

In addition to the above, an image display device of the present invention can be employed in an image display section of a digital still camera, a projector, a vehicle navigation system, or the like.

As described above, the present invention provides a high-quality-image display device provided with a matrix-array pixel section and a pixel-driving circuit section employing high-performance thin film transistor circuits operating with high-speed current mobility for driving the pixel sections, obtained by optimizing the layouts of various kinds of circuit sections on an insulating substrate constituting an active-matrix substrate.

What is claimed is:

1. An image display device provided with an active-matrix substrate comprising:
   an insulating substrate; and
   a plurality of circuit regions fabricated on said insulating substrate and including at least a pixel section and a pixel-driving circuit section, each of said pixel section and said pixel-driving circuit section having a poly-crystalline silicon semiconductor film,
   wherein at least one of said plurality of circuit regions has a first type of a thin film transistor and a second type of a thin film transistor, and
   an angular orientation of a direction of a current flowing through a channel of said first type of a thin film transistor is formed to be non-parallel with an angular orientation of a direction of a current flowing through a channel of said second type of a thin film transistor, wherein said plurality of circuit regions includes at least one pair of a first-type circuit region constituting a first circuit and a second-type circuit region constituting a second circuit, all thin film transistors in said first-type circuit region flow currents through channels thereof in one angular orientation, and angular orientations of currents flowing through channels of thin film transistors in said second-type circuit region are plural in number, and wherein, in said first-type circuit region, a peak-to-valley height difference of a surface of said channel, a source region and a drain region of said thin film transistors is equal to or smaller than 5 nm, and crystalline grains of said polycrystalline silicon semiconductor film are of a rectangular shape of 0.3 μm to 2 μm in width and 4 μm or more in length; and in said second-type circuit region, an average crystalline grain diameter is 1 μm or smaller and a peak-to-valley height difference of a surface is equal to or greater than 20 nm, in said channel, a source region and a drain region of said thin film transistors.

2. An image display device according to claim 1, wherein in said polycrystalline silicon films in a channel, a source region and a drain region of said thin film transistors constituting said pixel section, an average crystalline grain diameter is 1 μm or smaller, and a peak-to-valley height difference of a surface is equal to or greater than 20 nm, wherein in at least one of said plurality of circuit regions excluding said pixel section, crystalline grains of said polycrystalline silicon films are of a rectangular shape of 0.3 μm to 2 μm in width and 4 μm or more in length in a channel, a source region and a drain region of said thin film transistors, and a peak-to-valley height difference of a surface of said channel, said source region and said drain region of said thin film transistors is equal to or smaller than 5 nm.

3. An image display device according to claim 1, wherein said thin film transistors have plural kinds of gate insulating materials and plural kinds of thickness in ones of said plurality of circuit regions excluding said one of said plurality of circuit regions constituting said pixel section.

4. An image display device according to claim 1, wherein a level shifter, a sampling switch circuit and a buffer circuit constituting a pixel-driving circuit are fabricated in ones of said plurality of circuit regions excluding said one of said plurality of circuit regions constituting said pixel section, said channel, said source region and said drain region of said thin film transistors constituting said pixel-driving circuit are formed of polycrystalline silicon films having an average crystalline grain diameter of 1 μm or smaller and a peak-to-valley height difference of a surface equal to or greater than 20 nm, and said channel, said source region and said drain region of said thin film transistors constituting at least one of said circuits excluding said level shifter and said sampling switch circuit are formed of polycrystalline silicon films having crystalline grains of a rectangular shape of 0.3 μm to 2 μm in width and 4 μm or more in length and a peak-to-valley height difference of a surface equal to or smaller than 5 nm.

* * * * *